United States Patent
Hsu et al.

(10) Patent No.: US 7,132,856 B2
(45) Date of Patent: Nov. 7, 2006

(54) HYBRID CVSL PASS-GATE LEVEL-CONVERTING SEQUENTIAL CIRCUIT FOR MULTI-VCC MICROPROCESSORS

(75) Inventors: Steven K. Hsu, Lake Oswego, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 93 days.

(21) Appl. No.: 10/924,906

(22) Filed: Aug. 25, 2004

(65) Prior Publication Data

US 2006/0044013 A1    Mar. 2, 2006

(51) Int. Cl.
*H03K 19/0175*   (2006.01)
*H03K 19/096*    (2006.01)
*H03K 3/017*     (2006.01)
*H03K 3/356*     (2006.01)

(52) U.S. Cl. .................. 326/81; 326/97; 327/176; 327/201; 327/203

(58) Field of Classification Search .................. 326/81, 326/95–97; 327/172, 176, 201–203, 208–218
See application file for complete search history.

(56) References Cited

U.S. PATENT DOCUMENTS

| | | | |
|---|---|---|---|
| 5,612,632 A * | 3/1997 | Mahant-Shetti et al. ...... 326/46 |
| 6,429,711 B1 * | 8/2002 | Tschanz et al. ............. 327/211 |
| 6,535,433 B1 * | 3/2003 | Ooishi ................... 365/189.05 |
| 6,781,411 B1 * | 8/2004 | Steiss et al. .................. 326/46 |
| 6,809,554 B1 * | 10/2004 | Wada ........................ 326/81 |
| 2005/0285624 A1 * | 12/2005 | Hsu et al. ..................... 326/80 |

\* cited by examiner

*Primary Examiner*—Rexford Barnie
*Assistant Examiner*—Jason Crawford
(74) *Attorney, Agent, or Firm*—Fleshner & Kim LLP

(57) ABSTRACT

A logic circuit performs an internal level conversion function by driving portions of the circuit with different supply voltages. In one embodiment, first and second stage storage circuits are driven with different supply voltages. In another embodiment, first and second stage storage circuits are driven with a first supply voltage and an inverter coupled to the first stage storage circuit is driven with a second supply voltage. In either case, data transfer into the storage circuits may be controlled by different states of a clock signal. The logic circuit may be a flip-flop circuit, a latch circuit, or another type of circuit.

20 Claims, 9 Drawing Sheets

HYBRID CVSL PASS-GATE LEVEL-CONVERTING SEQUENTIAL CIRCUIT FOR MULTI-VCC MICROPROCESSORS

FIELD

This invention generally relates in one or more of its embodiments to electronic circuits which perform a level-conversion function embedded in a sequencing element.

BACKGROUND OF THE INVENTION

Many circuit applications require a voltage-level conversion to be performed for proper operation. In conventional designs, the conversion function is performed in an inefficient manner, often consuming precious chip area and increasing the processing overhead of the host system. Improvements are therefore needed in order to meet, for example, the rising demand for chip miniaturization and ever faster processing speeds.

DESCRIPTION OF THE PREFERRED EMBODIMENTS

Figure 1:
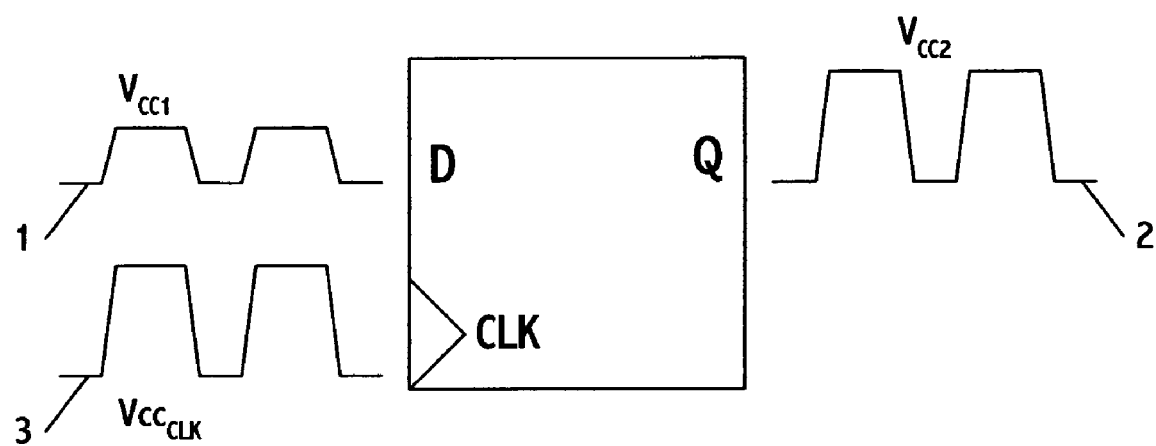
FIG. 1 is a diagram showing a level-conversion function that may be performed in accordance with at least one embodiment of the present invention.

FIG. 1 shows a logic circuit which performs a level-conversion function in accordance with one embodiment of the present invention. In this embodiment, a first voltage signal 1 is converted into a second voltage signal 2. The first voltage signal ($V_{cc1}$) is shown as having a low voltage and the second voltage signal ($V_{cc2}$) is shown as having a high voltage. In other embodiments, the opposite conversion may be performed, e.g., a high-voltage signal may be converted into a low-voltage signal. To perform these functions, level-conversion circuitry is preferably embedded in the logic circuit in order to reduce the size and overhead of the host system while simultaneously increasing its functionality and throughput.

Also, in FIG. 1, it is noted that the logic circuit is shown to be a D flip-flop driven by a clock signal 3 which depending on the embodiment may be the same as or generated based on either or only one of $V_{cc1}$ or $V_{cc2}$. In other embodiments, the clock signal may be different and/or other types of flip-flops, latches, and/or logic circuits may be adapted to perform the level-conversion function of the one or more embodiments of the present invention described herein. Moreover, the type and/or magnitude of the level conversion to be performed may be adapted to meet the requirements of an intended application.

Figure 2:
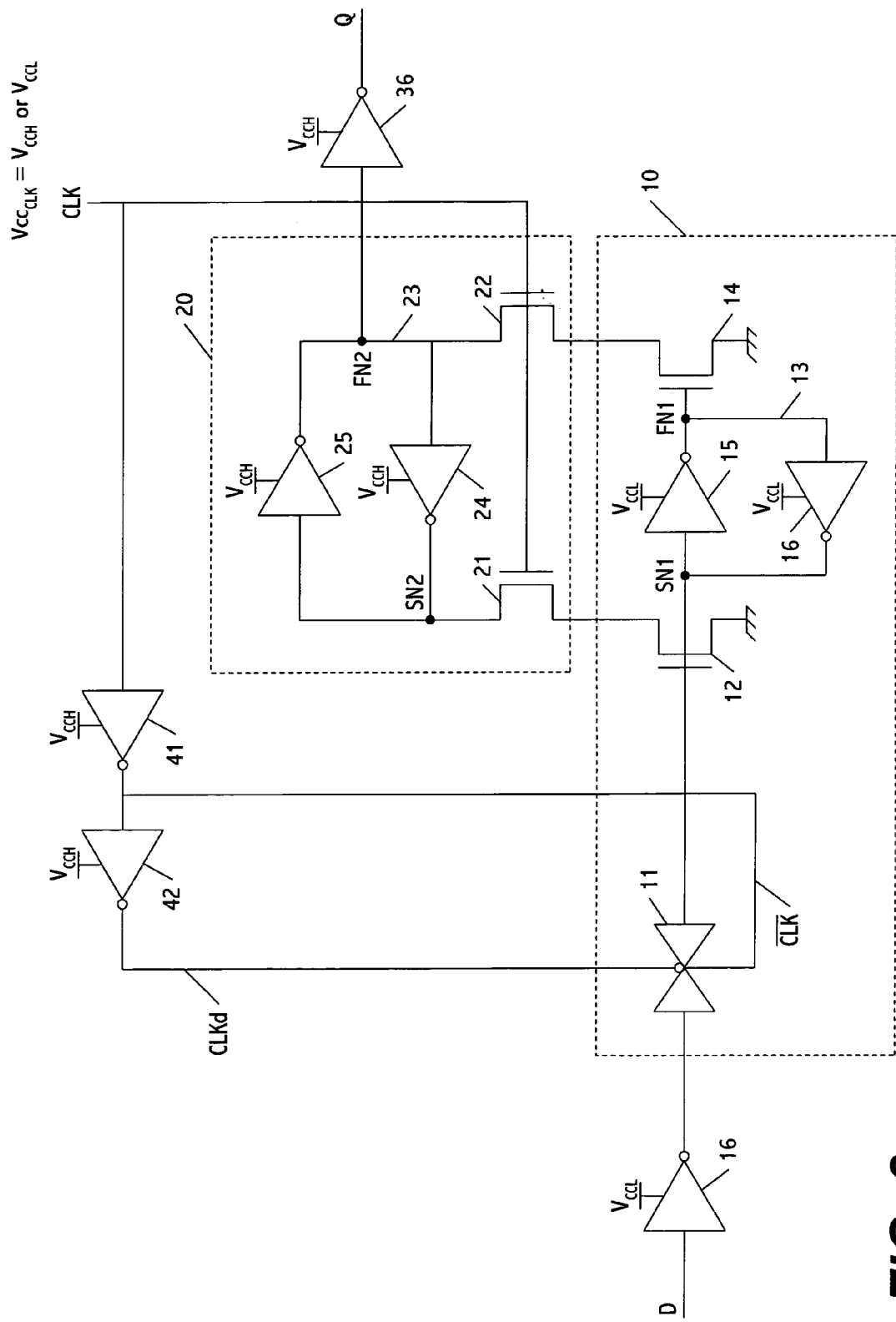
FIG. 2 is a diagram showing a logic circuit which performs a level-conversion function in accordance with one embodiment of the present invention.

FIG. 2 shows a circuit diagram of a D flip-flop having an embedded level-conversion circuit in accordance with one embodiment of the present invention. This flip-flop includes a master stage 10 and a slave stage 20 operating in different voltage supply domains. In this embodiment, the master stage operates in a first supply domain and includes a pass gate 11, an NMOS pull-down transistor 12, a keeper circuit 13, and an NMOS pull-down transistor 14. The keeper circuit is preferably formed from two cross-coupled inverters 15 and 16 and includes a storage node SN1 for storing a data value input through the pass gate and a feedback node FN1 for storing the complement of the input data value. The storage node is coupled to the gate of transistor 12 and the feedback node is coupled to the gate of transistor 14.

The slave stage operates in a second supply domain and includes transistors 21 and 22 and a keeper circuit 23. The keeper circuit may be formed from two cross-coupled inverters 24 and 25 and includes a storage node SN2 for storing the same logical value stored at node SN1. Feedback node FN2 stores the complement of the value stored at SN2. (The logical values stored at SN1 and SN2 are the same (e.g., logical 0 or 1), but the actual voltages corresponding to these values may differ by virtue of the different power supplies driving the master and slave stages. The same may be true for the logical values stored at FN1 and FN2.) Storage node SN2 is coupled to a terminal (drain or source) of transistor 21 and feedback node FN2 is coupled to a terminal (drain or source) of transistor 22. The gates of these transistors are coupled to a clock signal used to alternately activate the master and slave stages.

The master and slave stages operate in different domains by virtue of the different power supplies coupled to the keeper circuits. In this embodiment, a low voltage supply is coupled to the inverters in keeper circuit 13 and a high voltage supply is coupled to the inverters in keeper circuit 23; that is $V_{cc1}=V_{ccl}$ and $V_{cc2}=V_{cch}$. The master stage thus operates at low voltage and the slave stage performs the level conversion. Put differently, the different supplies effect the conversion of the low-voltage data value stored in the master stage keeper circuit into a high-voltage data value stored in the slave stage keeper circuit. The values of $V_{ccl}$ and $V_{cch}$ therefore control the level-conversion that takes place at the output of the flip-flop. (In an alternative embodiment, the opposite level-conversion may be performed). The low and high voltage supplies are also preferably coupled to input inverter 16 and output inverter 36.

In an exemplary application, for the D input $V_{cc1}$ may be less than, equal to, or greater than $V_{cc2}$ and clock signal clk can be equal to or operate based on either $V_{cc1}$ or $V_{cc2}$. (In the FIG. 5 embodiment, the clock signal may only operate on $V_{cc2}$). As for the keeper circuits, the logical values stored in keeper circuits 13 and 23 are the same (e.g., 0 or 1), but the analog voltages that represent these logical values may be different, e.g., a logical 1 in circuit 13 may be equal to or based on $V_{cc1}$ and a logical 1 in circuit 23 may be equal to or based on $V_{cc2}$. In FIG. 2, clk and clkd are logically the same value but "d" is added to indicate a delayed clock signal.

In operation, clock signal clk activates the master and slave stages of the flip-flop at different times. In this embodiment, the clock signal is passed through two inverters 41 and 42 prior to being input into the master stage. These inverters may be driven by the slave-stage power supply (e.g., $V_{cch}$), although a different supply may be used. The depicted arrangement is preferable for purposes of improving time-borrowing from the master stage to the slave stage. This, in turn, improves the minimum D-Q path delay of the flip-flop. In an alternative embodiment, the clock signal may be delayed using a different circuit arrangement.

When clk transitions from a high value to a low value, a high value (e.g., logical 1) is output from inverter 41 and a low value is output from inverter 42. These values activate pass gate 11, thereby causing the data value from the D input to pass to storage node SN1 of the keeper circuit 13. Because inverter 16 is driven by $V_{ccl}$, the data value transferred through pass gate 11 operates at or based on $V_{ccl}$. The voltage supply used to drive inverters 41 and 42 preferably correspond to high voltage supply $V_{cch}$, however a different voltage supply may alternatively be used.

Before passing to storage node SN1, the data value is inverted by inverter 15. The complement of the SN1 value is stored at FN1. The values stored at SN1 and FN1 are in the low-voltage domain as defined by voltage supply $V_{ccl}$, which not only drives inverter 16 but which also preferably drives the inverters of the keeper circuit. The low value of the clk turns off transistors 21 and 22, thereby ensuring that the voltages at SN1 and FN1 are maintained until a subsequent clock signal transition takes place.

During this operation, transistor 12 couples the value stored at SN1 to the slave stage. So when transistor 21 opens, if the value is 1 then SN2 will discharge. Conversely, if the value is 0 at SN1, when 21 opens nothing will happen to SN2, but FN2 will discharge since transistor 22 will be on and FN1 would have been 1 turning on transistor 14.

When clk transitions from a low value to a high value, a low value (e.g., logical 0) is output from inverter 41 and a high value from inverter 42. This de-activates the pass gate, thereby preventing the D input from passing into the master stage keeper circuit at this time. At the same time, a high value of clk turns on transistors 21 and 22, thereby causing the data values stored in the master-stage keeper to pass to the slave-stage keeper circuit, e.g., the logical value at SN1 passes to SN2 and the logical value at FN1 passes to FN2. The value at FN2 then passes to the Q output of the flip-flop through inverter 36, which is also preferably driven by the slave-stage power supply.

The slave stage of the flip-flop therefore performs the internal level-conversion function of the flip-flop, converting the input data value from the low-voltage domain ($V_{ccl}$) to the high-voltage domain ($V_{cch}$) at the output. This is accomplished by driving at least the keeper circuit of the slave stage with a higher voltage supply than is used to drive the master stage keeper. Also, the slave stage inverter 36 is preferably driven using the higher domain voltage and the clock signal clk may be the same as or different from the high-$V_{cc}$ Q output.

While the FIG. 2 embodiment performs a level conversion from a low voltage supply domain to a high voltage supply domain, the opposite level conversion can be performed by driving inverters 15, 16, and 17 with $V_{cch}$ and inverters 23, 24, 25 with $V_{ccl}$.

Figure 3A:
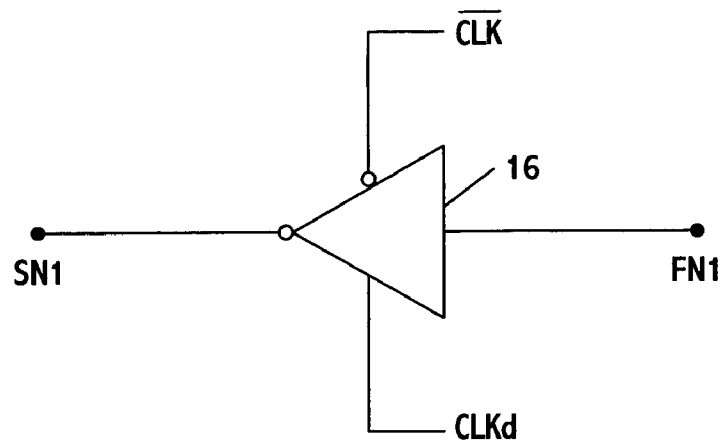
FIG. 3A is a diagram showing that the keeper circuit in the master stage of FIG. 2 may be formed from one or more clocked inverters.

FIGS. 3A–3D show alternative arrangements for the keeper circuits. FIG. 3A shows that inverter 16 may be a clocked inverter which store and output data based on clock signal clk and its complement $\overline{clk}$.

Figure 3B:
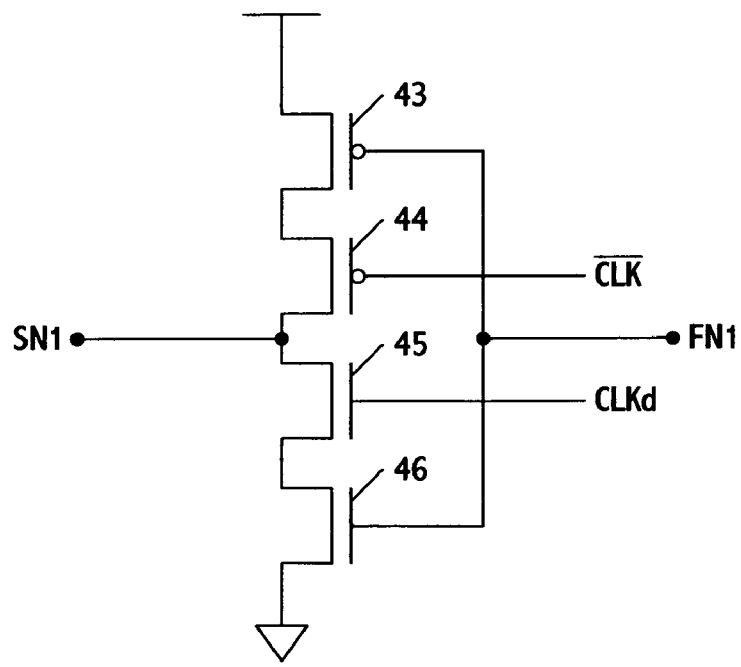
FIG. 3B is a diagram showing a transistor implementation of the inverter of FIG. 3A.

FIG. 3B shows one type of transistor implementation of the inverter of FIG. 3A. This implementation includes two PMOS transistors 43 and 44 and two NNOS transistors 45 and 46 coupled between a power supply and reference potential. Storage node SN1 is coupled between transistors 44 and 45, and feedback node FN1 is coupled to the gates of transistors 43 and 44. The gates of transistors 44 and 45 are coupled to $\overline{clk}$ and clk respectively.

Figure 3C:
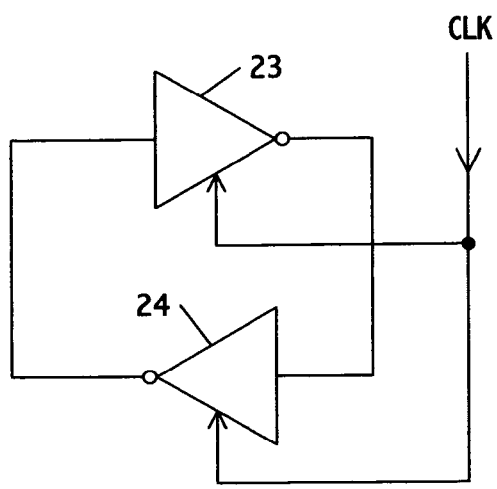
FIG. 3C is a diagram showing that the keeper circuit in the slave stage of FIG. 2 may be formed from clocked inverters.

FIG. 3C shows that keeper circuit 20 may be formed as an arrangement of clocked inverters, e.g., inverters 23 and 24 store and output data in accordance with clock signal clk.

Figure 3D:
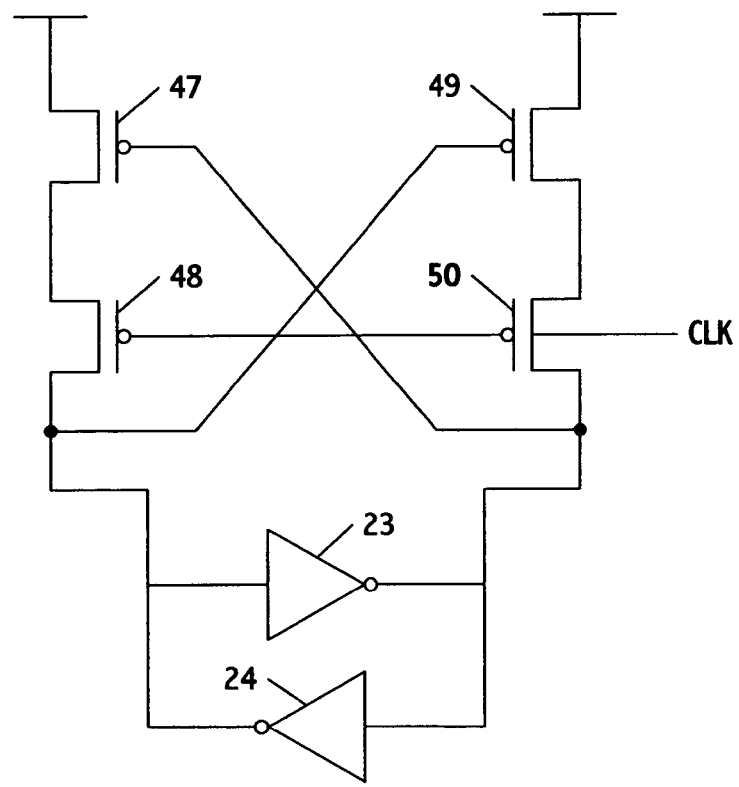
FIG. 3D is a diagram showing another circuit arrangement for the slave-stage keeper circuit.

FIG. 3D shows another implementation of keeper circuit 20. This implementation includes a cross-coupled arrangement of PMOS transistors 47 through 50. The gates of transistors 48 and 50 are coupled to an external signal, which may be clk. Any combination of the circuits shown in FIGS. 3A–3D may be incorporated into FIG. 2 for purposes of storing data therein.

Figure 4:
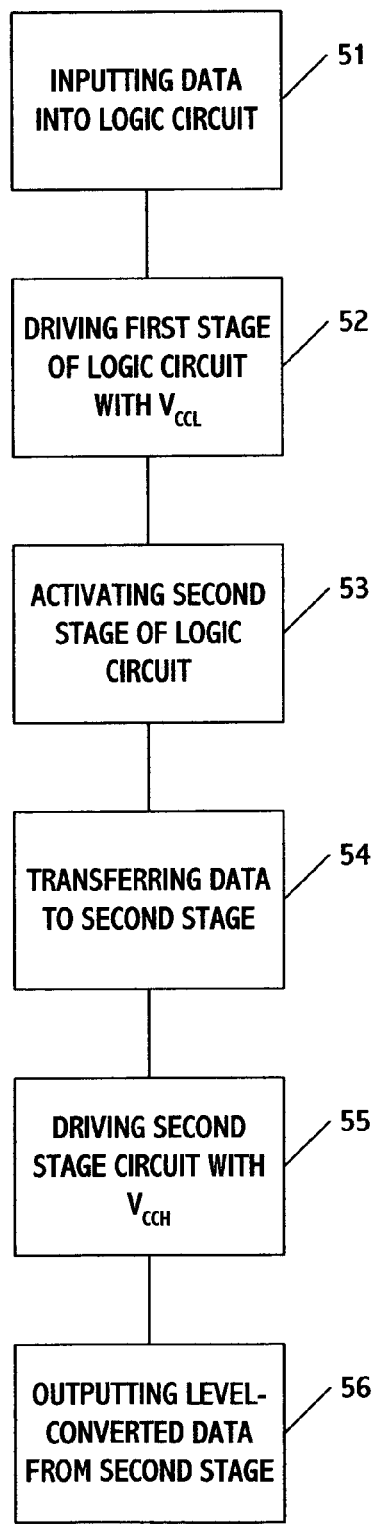
FIG. 4 is a flow chart showing functional blocks included in a method for performing a level conversion in accordance with one embodiment of the present invention.

FIG. 4 is a flow chart showing functional blocks included in a method for performing a level conversion in accordance with one embodiment of the present invention. The method may be performed by the circuit of FIG. 2 or by another circuit. The method includes storing an input data value in a first stage of a flip-flop circuit (Block 51) and then driving the first stage with a first supply voltage (Block 52). A second stage of the flip-flop circuit is then activated (Block 53), and then the value stored in the first stage of the flip-flop circuit is transferred for storage in the second stage (Block 54). The second stage is then driven with a second supply voltage different from the first supply voltage, thereby achieving the level conversion. (Block 55). The value stored in the second stage is then used as a basis for forming the output of the flip-flop. (Block 56). Preferably, the first and second stages are alternately activated by different states of a clock signal.

Figure 5:
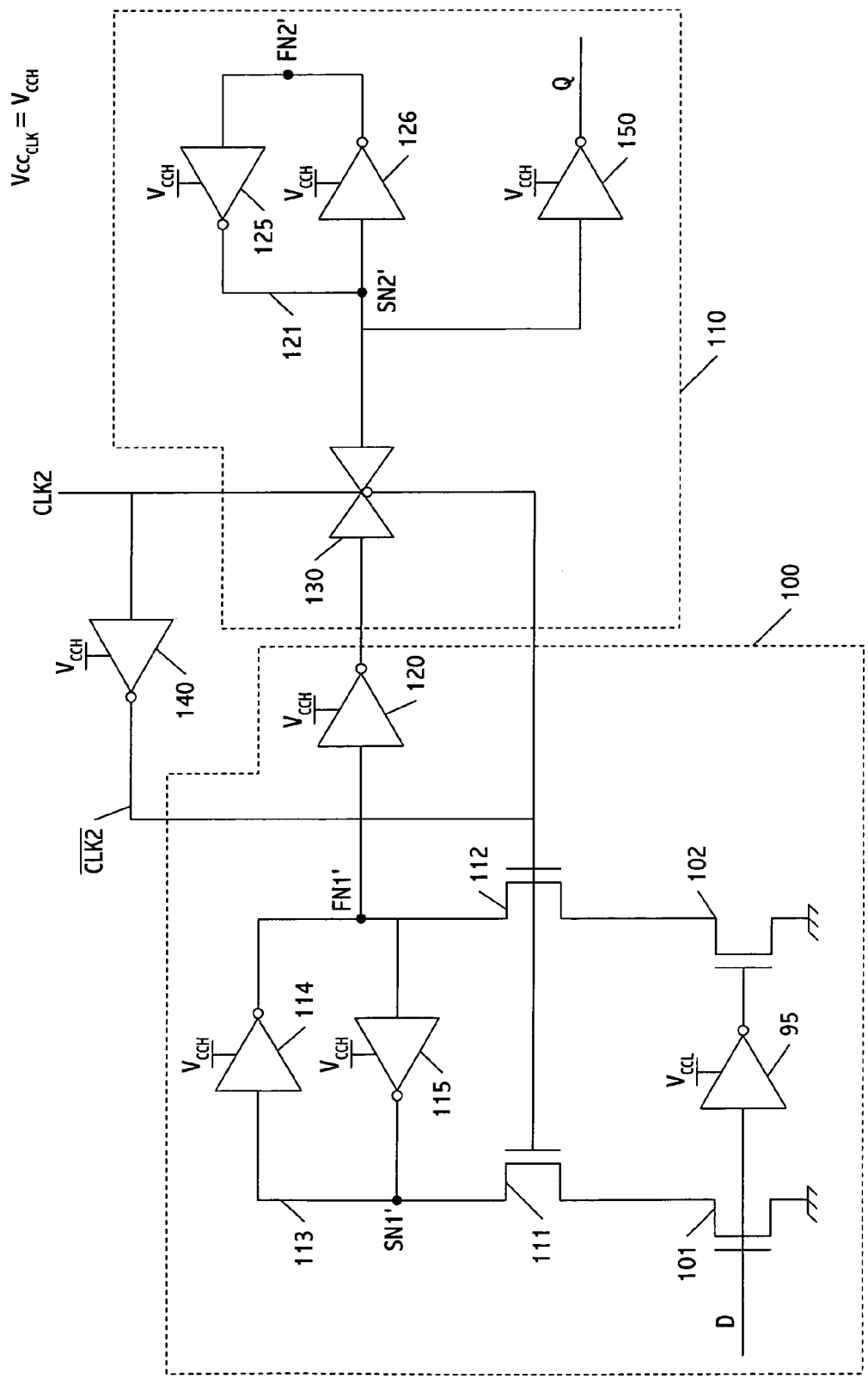
FIG. 5 is a diagram showing a logic circuit which performs a level-conversion function in accordance with another embodiment of the present invention.

FIG. 5 shows a circuit diagram of a D flip-flop having an embedded level-conversion circuit in accordance with another embodiment of the present invention. This flip-flop includes a master stage 100 and a slave stage 110 which operate in a same voltage supply domain. An inverter 95 coupled to the D input is driven by a different supply voltage. In FIG. 5, the master and slave stages are shown as being driven by a high voltage supply and inverter 95 by a low voltage supply. This embodiment may prove to be preferable for some applications, since by driving the master stage with a higher voltage supply will make the flip-flop less susceptible to noise.

The master stage includes a pull-down clocked NMOS transistor 111, a pull-down clocked NMOS transistor 112, and a keeper circuit 113 formed from cross-coupled inverters 114 and 115. Transistor 111 is coupled to the storage node SN1' of the keeper circuit and transistor 112 is coupled to the feedback node FN1'. Inverter 95, which inverts the input data value for storage at the feedback node FN1', is coupled between the gates of two transistors 101 and 102. Transistors 101 and 102 perform pull-down functions. When transistors 111 and 112 turn on, either 101 or 102 will pass a 0 to either SN1' or FN1' respectively. If SN1' is 0, then inverter 114 will pull FN1' to 1.

The slave stage includes a keeper circuit 121 having a storage node SN2' and feedback node FN2' disposed between cross-coupled inverters 125 and 126. The storage node of the slave stage is coupled to the feedback node of the master stage through a pass gate 130, which is operated based on an input clock signal clk2. In this embodiment, only one clocked inverter is used in order to reduce the clock power of the flip-flop. Also, in this embodiment the master and slave stages operate in a same voltage domain (e.g., $V_{cch}$) and only the input inverter 95 is driven by a different voltage supply. Since all stage nodes are driven at a high-voltage supply $V_{cch}$, this embodiment may prove to be more robust to noise than the previous embodiment. In all embodiments described herein, the feedback inverters in the keeper circuits may be sized to be weak or they can be fully interrupted based on the clock signal.

In operation, clock signal clk' activates the master and slave stages of the flip-flop at different times. When clk' transitions from a high value to a low value, a high value is output from inverter 140, thereby turning on transistors 111 and 112. As a result, the data value at the D input and its complement (generated by the output of inverter 95) respectively pass to storage and feedback nodes SN1' and FN1' of the master keeper circuit. Because the clock is low, the pass gate is not activated and thus the value stored at FN1' does not pass to the slave stage.

When clock signal clk' transitions from a low to a high value, a low value is output from inverter 140 to isolate the master stage from the D input. At the same time, pass gate 130 is activated to pass the logical value stored at node FN1' to the slave-stage keeper circuit through inverter 120. Preferably, both inverters 120 and 140 are driven by the same supply voltage, which, for example, may be the same supply voltage used to drive the master and slave stages, e.g., $V_{cch}$. In an alternative embodiment, these inverters may be driven by different supply voltages, at least one of which may differ from the master and slave stage supplies.

In the slave stage, the logical value output from inverter 120 is stored at node SN2' of keeper circuit 121 and the complement of this value is stored at node FN2'. The logical value stored at node SN2' is passed through an inverter 150 to form the Q output of the flip-flop. To maintain the level conversion, inverter 150 is driven by master- and slave-stage supply voltage, e.g., $V_{cch}$. Clock signal clk2 may equal or be based on $V_{cc2}$ in FIG. 1, which in this case may be the high-voltage power supply $V_{cch}$.

Figure 6A:
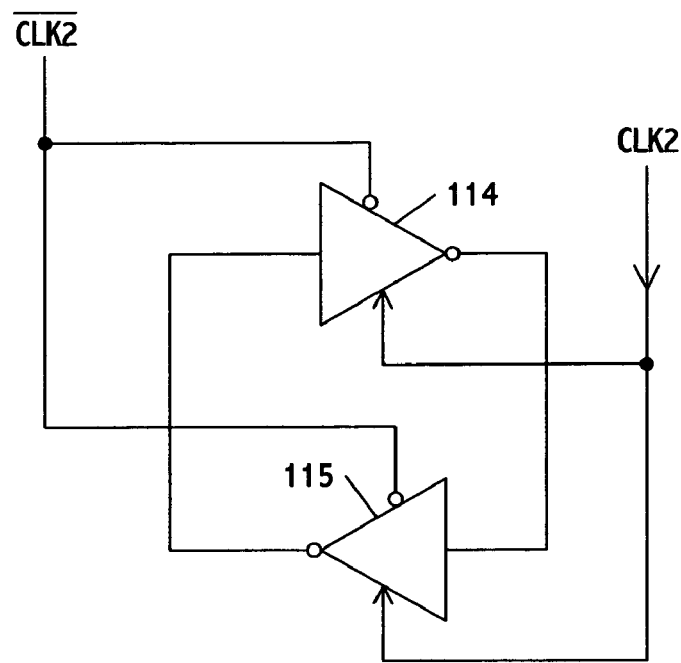
FIG. 6A shows an alternative arrangement for the master-stage keeper circuit.

FIG. 6A shows an alternative arrangement for the master-stage keeper circuit. In this version of the keeper, inverters 114 and 115 are clocked inverters, which store data based on when clk2 is high and $\overline{clk}$ 2 is low.

Figure 6B:
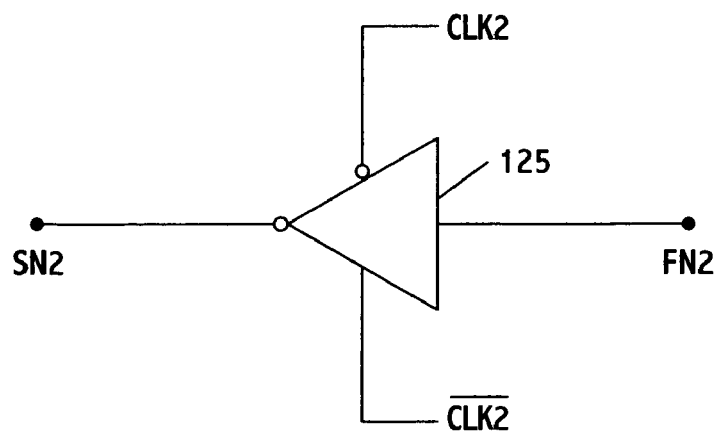
FIG. 6B shows an alternative implementation for one or more of the inverters which form the slave-stage keeper circuit.

FIG. 6B shows an alternative implementation for one or more of the inverters which form the slave-stage keeper circuit. In this implementation, inverter 125 is a clocked inverter and the other inverter in this keeper may have a similar arrangement. Inverter 125 functions as an inverter when clk2 is low and $\overline{clk}$ 2 is high. When clk2 is high and $\overline{clk}$ 2 is low, the inverter is tri-stated allowing pass gate 30 to write into SN2' without contention. Basically, when this pass gate is closed, inverter 125 functions like an inverter and when 20 is open the inverter is tri-stated.

Figure 7:
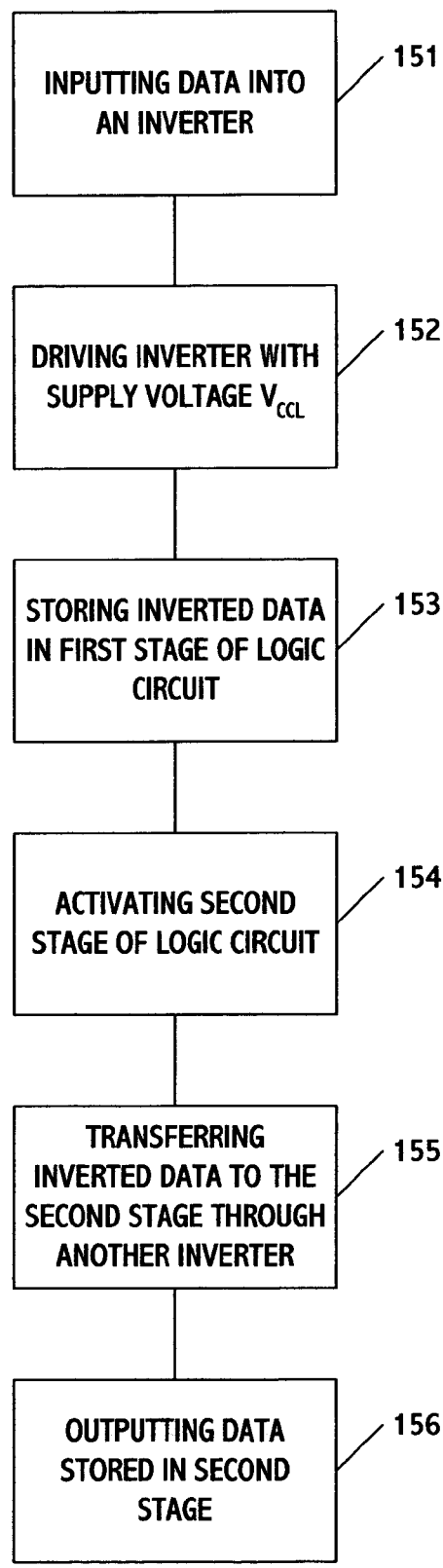
FIG. 7 is a flow chart showing functional blocks included in a method for performing a level conversion in accordance with another embodiment of the present invention.

FIG. 7 is a flow chart showing functional blocks included in a method for performing a level conversion in accordance with another embodiment of the present invention. The method may be performed by the circuit of FIG. 5 or by another circuit. The method includes passing an input data value through an inverter (Block 151) and then driving the inverter with a first supply voltage (Block 152). The inverted value is then transferred for storage into a first stage of a flip-flop circuit. (Block 153). A second stage of the flip-flop circuit is then activated (Block 154), and the value stored in the first stage is transferred through another inverter for storage in the second stage (Block 155). The first and second stages are driven with at least a second supply voltage. Depending on the application, the first and second stages may be driven by different supply voltages, both of which are different from the first supply voltage. The value stored in the second stage is then used as a basis for forming the output of the flip-flop. (Block 156). Depending on the type of flip-flop, the second stage output value may be inverted. Preferably, the first and second stages are alternately activated by different states of a clock signal.

The level conversion performed by foregoing embodiments are illustratively described as being included in flip-flop circuits. The use of flip-flop circuits, while preferable, is by no means a necessity. Rather, the level conversions described herein may be incorporated in a variety of other logic circuits including but not limited to latches, flip-flops, and mux latches.

Also, the logic circuits may themselves be included in a variety of higher-level circuits or systems, one example of which includes a microprocessor system operating in two or more voltage supply ($V_{cc}$) domains. In one common design, one domain operates based on a low voltage supply ($V_{ccl}$) and another domain operates based on a high voltage supply ($V_{cch}$). Or, in an adaptive voltage environment, the first voltage domain can be less than or greater than the second voltage domain, or the domains may be equal, at any time during operation. One or more embodiments of the present invention may be used to perform a level-conversion between these domains. Put differently, a logic circuit in accordance with any one or more of the embodiments previously described may be used, for example, to latch or store a data value while simultaneously serving as a level-conversion interface between low-$V_{cc}$ and high-Vcc domains. Other higher-level systems which may include a logic circuit in accordance with any of the embodiments described herein include but are not limited to multi-core processors, system-on-chip, core-to-cache interface, and multi-voltage ASICS.

Figure 8:
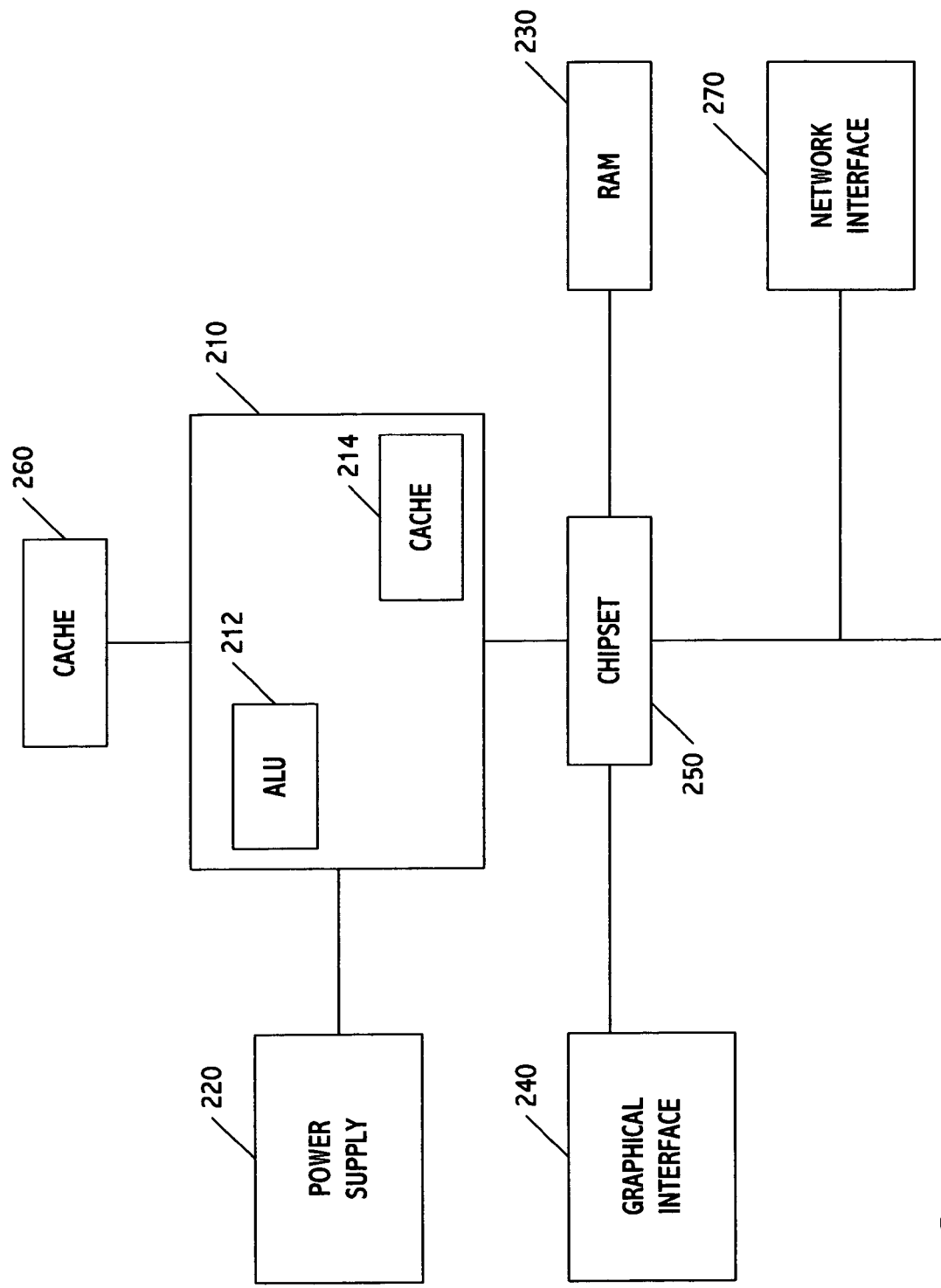
FIG. 8 is a diagram showing a processing system which may include a logic circuit and/or perform a level-conversion function in accordance with one or more embodiments of the present invention.

FIG. 8 is a diagram of a processing system which includes any one or more embodiments of the present invention. The processing system includes a processor 210, a power supply 220, and a memory 230 which, for example, may be a random-access memory. The processor may include an arithmetic logic unit 212 and an internal cache 214. The system may also include a graphical interface 240, a chipset 250, a cache 260 and a network interface 270. The processor may be a microprocessor or any other type of processor. Also, the processor may be included on a chip die with all or any combination of the remaining features, or one or more of the remaining features may be electrically coupled to the processor die through known connections and interfaces. A logic circuit that performs a level-conversion function in accordance with any of the aforementioned embodiments may be included in any one or more blocks shown in FIG. 6.

For example, if any of the blocks in FIG. 8 are operating at a different voltage, then a voltage conversion may be performed in accordance with any of the embodiments of the present invention described herein. Thus, if any of the blocks have different voltage planes, these embodiments may be used to interface between the planes. The embodiments described herein are not tied to an specific "logic" block. One example could be a core-to-cache interface in a microprocessor, where the core and cache operate at different voltages. In this case, level-converting flip-flops can be used at the interface.

The embodiments previously discussed may be modified in various ways. For example, the master and slave stages in the FIG. 5 are both shown to be driven by a same supply voltage. In an alternative embodiment, these stages may be driven different supply voltages, both of which may be different from the supply voltage used to drive the initial inverter 95. In this case, a three-level voltage conversion may be performed. As another alternative, the supply voltage driving inverter 95 and the slave stage may be the same and the supply voltage driving the master stage may be different. Other variations are also possible.

In the foregoing embodiments, the flip-flops include an embedded level-conversion function that reduces the penalty of the level conversion compared with other designs which have been proposed. Through the flip-flops, the disclosed embodiments also provide an easy way to interface the different voltage supply domains. These embodiments may also be implemented in a manner which allows the flip-flops to operate with low power and high speed while simultaneously performing the level-converting function. The embodiments may be implemented in a manner which avoids static current due to a low $V_{cc}$ signal interfacing incorrectly, which is a problem resident in many other designs. While these benefits are desirable for some applications they are not to be limiting of the invention, i.e., the embodiments of the present invention may be implemented in a manner which does not achieve one or more of these benefits.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. A logic circuit, comprising:
a first inverter to invert input data;
a first stage storage circuit to store the inverted data;
a second stage storage circuit to store data from the first stage storage circuit; and
a second inverter to invert data output from the second stage storage circuit, wherein:
the second stage storage circuit converts the data from a first voltage level to a second voltage level of a same logical value,
each of the first and second stage storage circuits includes cross-coupled inverters with opposing storage and feedback nodes, and
the first inverter is coupled to the storage node of the first stage storage circuit and an input node of the second inverter is coupled to the feedback node of the first stage storage circuit through the feedback node of the second stage storage circuit.

2. The logic circuit of claim 1, wherein the data voltage conversion results from driving the first and second stage storage circuits using different voltage supplies.

3. The logic circuit of claim 1, wherein the first and second stage storage circuits are alternately activated by different states of a clock signal.

4. The logic circuit of claim 1, further comprising:
a pass gate coupled between the first inverter and the first stage storage circuit, wherein the pass gate transfers the inverted data to the first stage storage circuit based on a clock signal.

5. The logic circuit of claim 4, wherein different states of the clock signal alternately activate the first and second stage storage circuits.

6. The logic circuit of claim 1, wherein the first inverter is driven by the supply voltage of the first stage storage circuit and the second inverter is driven by the supply voltage of the second stage storage circuit.

7. The logic circuit of claim 1, wherein the first and second stage storage circuits are connected to form a flip-flop.

8. A logic circuit, comprising:
a first inverter to invert data;
a first stage storage circuit to store the inverted data; and
a second stage storage circuit coupled to the first stage storage circuit, wherein the first stage storage circuit converts the inverted data from a first voltage level to a second voltage level of a same logical value, the data voltage conversion resulting from driving the first inverter using a first voltage supply and the first and second stage storage circuits using a second voltage supply.

9. The logic circuit of claim 8, further comprising:
a second inverter coupled between the first and second stage storage circuits.

10. The logic circuit of claim 8, wherein data transfer into the first and second stage storage circuits are alternately controlled by different states of a clock signal.

11. A logic circuit, comprising:
a first inverter to invert data;
a first stage storage circuit to store the inverted data; and
a second stage storage circuit coupled to the first stage storage circuit, wherein the first stage storage circuit converts the inverted data from a first voltage level to a second voltage level of a same logical value, and
wherein each of the first and second stage storage circuits includes cross-coupled inverters with opposing storage and feedback nodes, and wherein the first inverter and the storage node of the second stage storage circuit are coupled to the feedback node of the first stage storage circuit.

12. The logic circuit of claim 8, wherein the first and second stage storage circuits are connected to form a flip-flop.

13. A method, comprising:
passing data through an inverter;
storing the inverted data in a first stage storage circuit;
converting the stored data from a first voltage level to a second voltage level of a same logical value by driving the inverter and the first stage storage circuit with different supply voltages; and
transferring the stored data at the second voltage level to a second stage storage circuit, wherein the first and second stage storage circuits are driven by a same supply voltage.

14. The method of claim 13, further comprising:
inverting the stored data at the second voltage level before said transfer.

15. The method of claim 13, further comprising:
controlling data transfer into the first and second stage storage circuits based on different states of a clock signal.

16. A system, comprising:
a first circuit operating in a first supply voltage domain;
a second circuit operating in a second supply voltage domain; and
a logic circuit coupled between the first and second circuits and including (a) a first stage storage circuit to store data from the first circuit, and
(b) a second stage storage circuit to store the data transferred from the first stage storage circuit, wherein the first stage storage circuit operates based on the first supply voltage domain and the second stage storage circuit operates based on the second supply voltage domain.

17. The system of claim 16, wherein the first circuit, second circuit, and logic circuit are on a same chip.

18. The system of claim 16, wherein the first circuit and second circuit are selected from the group consisting of a processor, a cache, a chip set, a graphical interface, a network interface, and a power supply.

19. The logic circuit of claim 11, wherein the data voltage conversion results from driving the first inverter using a first voltage supply and at least one of the first stage storage circuit or the second stage storage circuit using a second voltage supply.

20. The logic circuit of claim 11, wherein the data voltage conversion results from driving the first inverter using a first voltage supply and the first and second stage storage circuits using a second voltage supply.

* * * * *